United States Patent
Butler

(10) Patent No.: US 7,433,018 B2
(45) Date of Patent: Oct. 7, 2008

(54) PATTERN ALIGNMENT METHOD AND LITHOGRAPHIC APPARATUS

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 111 days.

(21) Appl. No.: 11/317,232

(22) Filed: Dec. 27, 2005

(65) Prior Publication Data

US 2007/0146669 A1 Jun. 28, 2007

(51) Int. Cl.
G03B 27/42 (2006.01)
(52) U.S. Cl. .............................. 355/53; 355/67; 355/72; 355/75; 356/490; 356/500
(58) Field of Classification Search ............. 355/53, 355/67, 72, 75; 356/490–510
See application file for complete search history.

(56) References Cited

U.S. PATENT DOCUMENTS 5,160,848 A * 11/1992 Saitoh et al. ............... 250/548
6,772,084 B2 * 8/2004 Bischoff et al. ............ 702/127
2005/0123844 A1 * 6/2005 Monshouwer ............... 430/22
2007/0127025 A1 * 6/2007 Abdulhalim et al. ........ 356/400

* cited by examiner

Primary Examiner—Della J. Rutledge
(74) Attorney, Agent, or Firm—Sterne, Kessler, Goldstein & Fox P.L.L.C

(57) ABSTRACT

A method for aligning a substrate in a lithographic apparatus, the method including irradiating a first target portion of the substrate with a first patterned beam to form a first pattern on the substrate. Then, a second target portion of the substrate is irradiated with a second pattern beam to form a second pattern on the substrate. The second target portion at least partly overlaps the first target portion. A diffraction beam is detected during irradiation of the second pattern, due to a diffraction of the second patterned beam on the first pattern. The diffraction beam is compared with a desired diffraction beam, and the substrate is aligned based on a comparison between the detected diffraction beam and the desired diffraction beam.

30 Claims, 6 Drawing Sheets

PATTERN ALIGNMENT METHOD AND LITHOGRAPHIC APPARATUS

BACKGROUND

1. Field of the Invention

The present invention relates to a method for aligning a substrate in a lithographic apparatus and to a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithography, such as for the manufacture of integrated circuits or other semiconductor structures, it is common that a plurality of layers are applied onto the substrate. This implies that a substrate is to be processed a plurality of times. Each time a pattern is to be created, the substrate may be provided with a layer of a photosensitive resist, followed by irradiating by the lithographic apparatus a pattern onto the substrate, thereby selectively irradiating a desired portion of the resist applied to the surface of the substrate. After a further processing of the substrate has taken place, which may include any suitable processing step, such as etching, ion implantation, diffusing, or any other operation which may be known to the skilled person per se, a following irradiation is to take place. Due to an ever increasing complexity of semiconductor structures or other devices to be produced with the aid of the lithographic apparatus, requirements on a complexity of the pattern, e.g. increasing a resolution thereof, decreasing a size of elements of the pattern, etc, and requirements on alignment of the substrate increase. In this context, the term alignment is to be understood as an alignment of a substrate on which a previous pattern has been applied, to the patterned beam of the lithographic apparatus for applying a following pattern onto the substrate. This may be easy understood by realizing that the smaller the structures of the pattern to be applied onto the substrate, the more critical a matching between a position of the following pattern with respect to the pattern already applied onto the substrate, becomes.

In a current lithographic apparatus a plurality of means are used to be able to provide an adequate alignment. Most of these are position measurement devices to measure a position of a substrate table holding the substrate, position measurement devices to measure a position of a support to support a patterning device which provides the pattern to be irradiated. Further, a measurement system may be provided to optically measure a relationship between the support and/or patterning device and the substrate table. Thereto, a measurement device may be provided on the substrate table (e.g., comprising a lightsource and a detector). Thereby, a relationship between the substrate table and the support or patterning device may be determined with the aid of a measurement beam which is projected from the support or patterning device onto the substrate table, and/or vice versa, via a projection system. An example thereof are the so-called TIS (Transmission Image Sensors) which may be provided on the substrate table, and measures its position with respect to a projection beam that is formed by irradiating a particular pattern provided on the patterning device (a marker). Any of these known measurement systems are prone to errors which may be caused by a plurality of effects. At first, many of the measurements determine a position of the patterning device towards the substrate table instead of to the substrate itself. Similarly, commonly a position of the support to hold the patterning device is determined instead of the position of the patterning device itself. Furthermore, the substrate table and/or the support may comprise a large range of movement which implies that sensing systems being able to operate over such a large range of movement are to be applied. Therefore, optical beams or other means may have to travel long measurement paths which may cause errors due to atmospheric gas turbulences, temperature variations, etc. Furthermore, these measurement systems do not measure a relative position of patterning device and substrate with respect to each other, however measure, e.g., the substrate table with respect to a reference and/or the support or patterning device with respect to another or the same reference. Thereby, a long measurement path comes into existence, e.g. ranging from the substrate via the substrate table via a measurement beam to, e.g., a measurement device (such as an interferometer, encoder, etc.), via a reference structure (such as a metrology frame), via a further measurement device (such as a interferometer, encoder etc.), then again via a measurement beam to the support and finally from the support to the patterning device. Thus, such a measurement path includes a plurality of positioning relationships between the various elements. In each of these elements/or relations therebetween, errors may be introduced due to temperature fluctuations (causing thermal expansion of one or more elements, due to position inaccuracies of an element with respect to another one (e.g., a position inaccuracy of the substrate with respect to the substrate table), etc. Furthermore, another source of error is in an initial positioning of a layer onto the substrate. When the layer is processed in a first processing cycle where, e.g., a first pattern is applied onto the substrate, a position of that pattern with respect to a reference on the substrate is to be determined. Such a reference may, e.g., be a border of the substrate or comprise reference markers on the substrate itself. It is possible that these reference markers are included in the pattern to be applied first onto the substrate, thereby aiding in a following positioning of the substrate to apply a further pattern.

Despite the many different measurement systems and techniques used, a highly accurate alignment of the substrate is still considered troublesome and thereby limiting a performance of the lithographic apparatus, e.g. in terms of a match between subsequently apply layers, and therefore in terms of minimum dimensions of the structures to be achievable in such layers.

SUMMARY

It is desirable to improve an alignment of a substrate in a lithographic apparatus.

According to an embodiment of the invention, there is provided a method for aligning a substrate in a lithographic apparatus, the method including irradiating a first target portion of the substrate with a first patterned beam to form a first pattern on the substrate, irradiating a second target portion of the substrate with a second patterned beam to form a second pattern on the substrate, the second target portion at least partly overlapping the first target portion, during irradiating the second pattern, detecting a diffraction beam due to a diffraction of the second patterned beam on the first pattern, comparing the diffraction beam with a desired diffraction beam, and aligning the substrate making use of a difference between the detected diffraction beam and the desired diffraction beam.

According to a further embodiment of the invention, there is provided a lithographic apparatus to project a pattern onto a substrate, the lithographic apparatus to irradiate a first target portion of the substrate with a first patterned beam to form a first pattern on the substrate, and to irradiate a second target portion of the substrate with a second patterned beam to form a second pattern on the substrate, the second target portion at least partly overlapping the first target portion, the lithographic apparatus including a detector to detect, during irradiating the second pattern, a diffraction beam due to a diffraction of the second patterned beam on the first pattern, and a comparator to compare the diffraction beam with a desired diffraction beam, and a positioning system to align the substrate making use of a difference between the detected diffraction beam and the desired diffraction beam.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
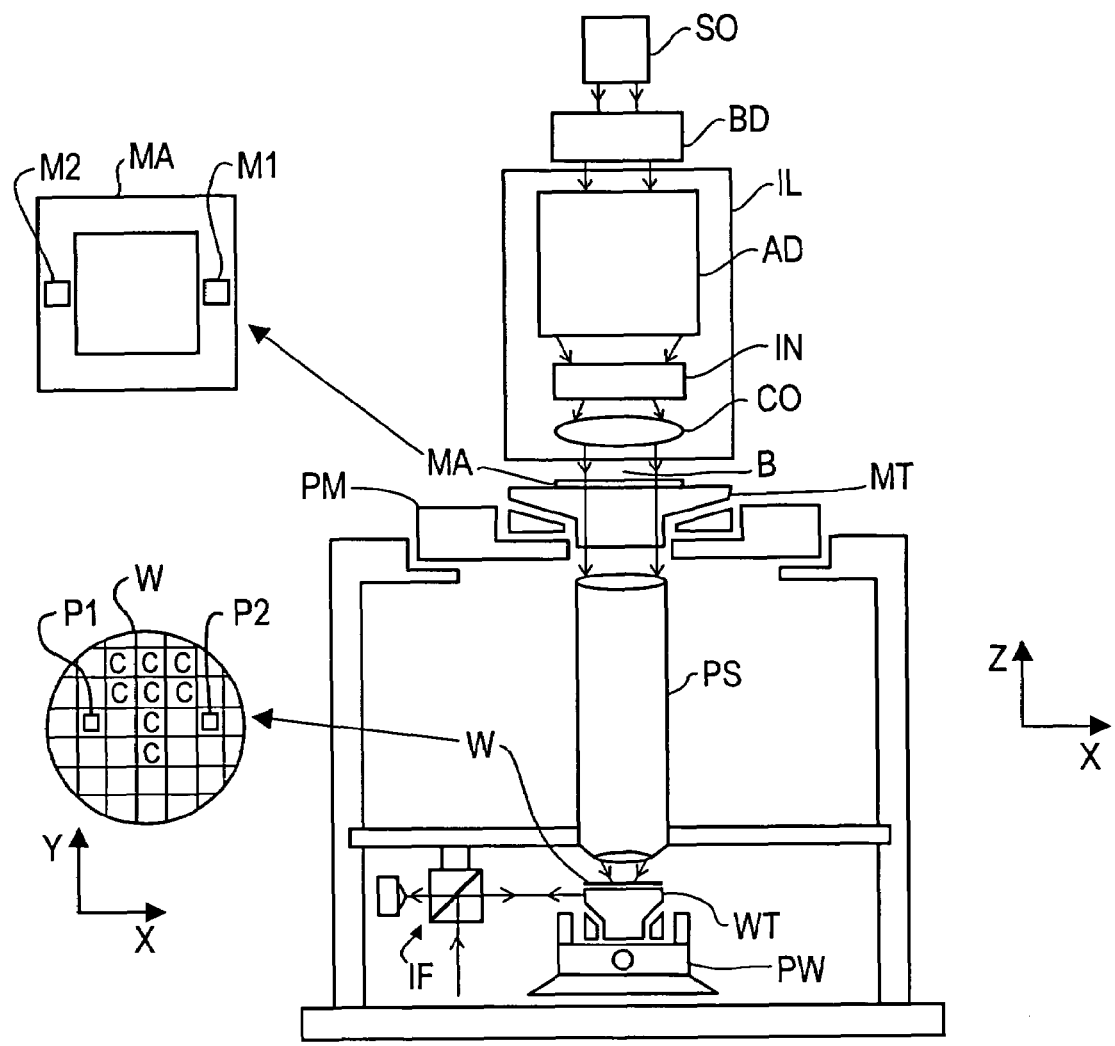
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In this document, the term target portion may be understood in a plurality of ways. In general, the target portion of the substrate includes an area on a surface of the substrate which is irradiated by the lithographic apparatus at one moment in time. As explained above, a plurality of irradiation concepts may be used, including e.g. scanning, stepping and maskless lithography. In step mode, the term target portion mat be understood as a portion of the surface of the substrate which is irradiated at once: as an example, in the target portion of the substrate, a die or a plurality of dies may be projected at once. In the scan mode, the target portion may correspond to an area on the substrate which is irradiated at once. In the scan mode, successive target portions within a single scanning of the substrate, may thus overlap. In maskless lithography, the target portion may correspond to a spot of a radiation pulse during the scan.

Figure 2:
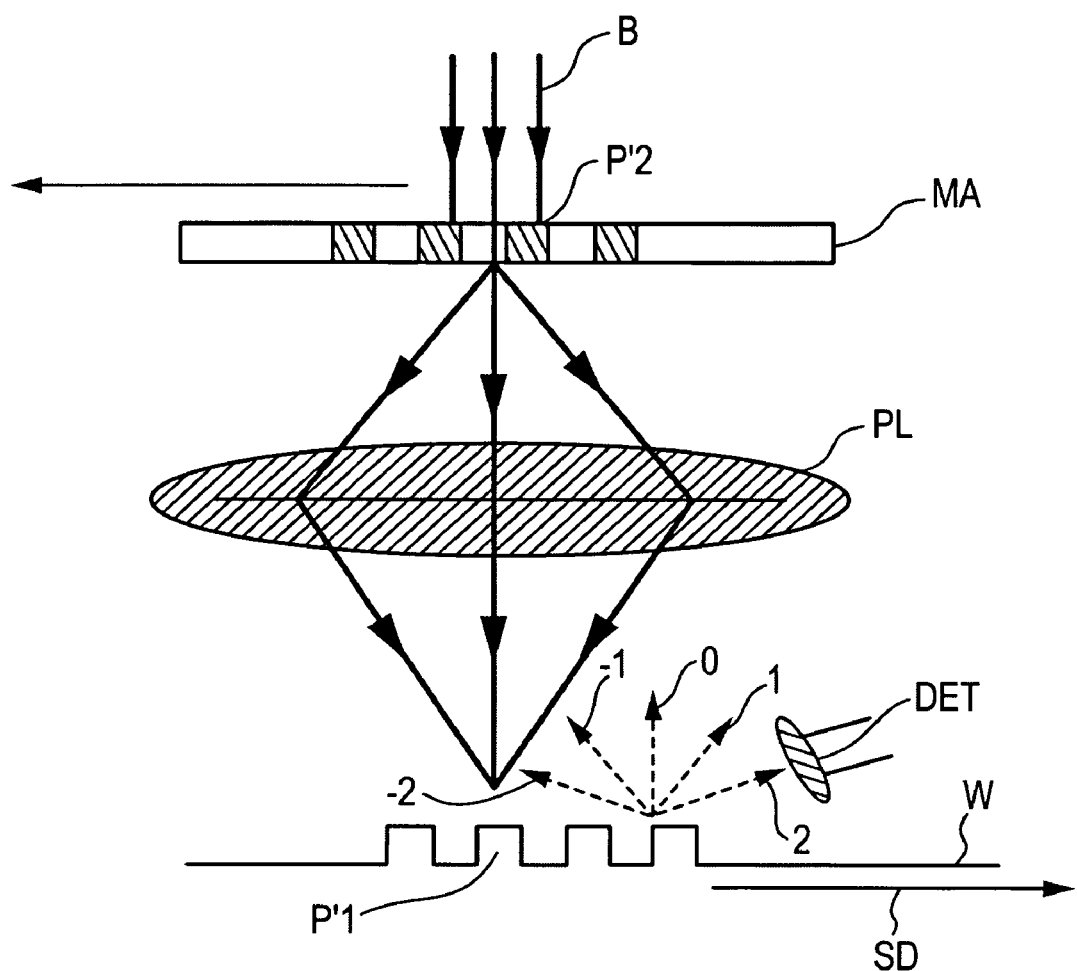
FIG. 2 depicts a setup for an alignment according to an embodiment of the invention.

FIG. 2 depicts a schematic view, partly in cross-section, of the beam B, the patterning device MA, a projection lens PL forming part of and in this example representing the projection system PS, and substrate W. The beam B as provided by the illumination system IL as depicted and described with reference to FIG. 1, is incident on the mask MA. The mask MA includes a pattern, indicated by P'2. A part of the beam B is transmitted by the mask, thereby generating diffractions of the beam B, which travel to the projection lens PL. By the projection lens PL, the beam B including some or all of the diffractions, are converged again at an image plane which is to coincide substantially with the surface of the substrate W.

At the surface of the substrate W, a previous pattern has already been applied, indicated here by P'1. For illustrative purposes, the pattern P'1 has been drawn here as a plurality of equiformed protrusions, however may include any form. Instead of protrusions, indents may be provided, or differences in a diffraction coefficient, absorption coefficient, or any other difference which translates into an interaction with the beam B which has been patterned by the mask MA, the beam B arriving at the pattern P'1 on the substrate W.

At the substrate W, again a diffraction will take place of the beam on the pattern P'1. In this example creating a zero order (reflecting) diffraction (indicated here as 0) first and minus first order diffractions (indicated here as 1 and −1), and second and minus second order diffractions (indicated here as 2 and −2). These diffractions depend on a structure and position of the pattern P'1. The diffractions however also depend on a structure, pattern and position of the mask MA. As pattern P'2 thereof effects the incoming beam. This effect implies that a displacement of the substrate W relative to the mask MA in a scanning direction which is indicated here with the arrow SD will result in a change of the diffraction patterns, i.e. a difference in intensity of one or more of the zero, first and minus first, second and minus second order diffractions.

The pattern P'2 is required to be projected onto substrate W in a predetermined position relationship to the pattern P'1, in other words the pattern P'2 when applied to the substrate W is required to be aligned to the pattern P'1 which has been applied to the substrate W previously. At this desired position relationship, a certain diffraction takes place, resulting in a certain intensity of each of the diffractions, such as the zero order, first and minus first order, second and minus second order diffractions shown here. FIG. 2 further shows a detector DET which in this example detects one of the diffractions, i.e. in this example second order diffraction 2. Giving an optimum alignment between the pattern P'2 of the mask MA and the pattern P'1 on the substrate W, a certain intensity of the diffraction (in this example the second order diffraction) is detected. In case that alignment is not optimum, thus the position of the pattern P'2 not matching the position of the pattern P'1, then a difference in the diffractions will occur, which translates into a different intensity received by detector DET.

It is now possible to derive from a difference between the diffraction detected by the detector DET and the expected diffraction in case of a perfect alignment between the pattern P'2 and the pattern P'1, an amount of misalignment. This may be performed in various ways as will be explained below in more detail. In any case, having determined a difference between the diffraction and the expected diffraction. It is possible to perform corrective actions to correctly position the mask MA with respect to the substrate W. This may be done by correcting a position of the substrate table WT and/or the support MT making use of the existing positioning device of the substrate table WT and/or mask table MT, such as linear motors or any other type of actuators. When irradiating the substrate, a target portion thereof may be irradiated at once. As explained above, the substrate may be irradiated per target portion at once, the target portion may correspond to an effectively used surface of the substrate, however it is not uncommon that irradiation is performed for smaller parts of the surface of the substrate at once, as explained above (e.g. scanning, stepping, maskless). For each of such target portions, it is desirable that the second pattern as irradiated onto the second target portion of the substrate is aligned to the first pattern which has already been applied to the substrate before. Thereby, the second pattern is to be understood as a pattern of a layer, which layer is applied onto the substrate after a layer including the first pattern has been applied onto the substrate. The second target portion should at least partly overlap the first target portion, to provide a diffraction of the beam providing the second pattern with the first pattern which has been provided on the substrate before.

In the context of this document the term pattern may be understood as a pattern in the patterning device (also called reticle) or other patterned beam, thus a pattern included in the irradiation for irradiating the substrate. Also, the term pattern may in this document be understood as a pattern on the substrate, thus a physical structure on the substrate such as metallization pattern, ion implantation pattern, diffusion pattern, etched away structure, or any other structure on or in the substrate that will interact with the irradiation of the second pattern when irradiated onto the substrate, whereby a diffraction may be created. The pattern may be provided by a mask, whereby, depending on the type of irradiation, the mask may be irradiated as a whole, or only a part of the mask may be irradiated at once, such as may be the case in the scan mode. The term pattern as described here, may hence refer to a full pattern (such as a mask pattern or a pattern, such as a die, on the substrate) however the term pattern as employed here may also include any suitable part thereof.

In the examples as provided here, a pattern P'2 is applied to pattern the beam B thereby creating a patterned beam. In addition or instead, any other patterning method may be applied, e.g. by maskless lithography, etc.

It is common that, e.g. during a scanning motion of the substrate and the patterning device, only a part of the substrate is irradiated at once. The first and second target portions thus in that case correspond to a part of the surface of the substrate only. Each such irradiated part of the substrate, having a different pattern P'1 thereon and a different patterned beam P'2, may have a different desired diffraction beam that would be detected by the detector in case of a an optimum alignment between the pattern P'2 and the pattern P'1. Hence, the desired diffraction pattern depends on the position of the irradiated part of the substrate, thus the position of the target portions. Therefore, it may be the case that for each position of the target portions, a different desired diffraction beam as detected by the detector may be stored in, e.g., a memory of the lithographic apparatus. For each of these target portions, the diffracted beam may be detected by the detector, a difference between the desired diffraction beam and the measured diffraction beam determined, and an alignment performed. Also it may be possible that the described acts of detecting the diffracted beam, comparing and aligning, are performed for a subset of the target portions on the substrate only. As an example, the target portions for which the above acts may be performed may be target portions in which alignment markers are provided, thus in which alignment markers are included in preferably the first and second patterns. Thereby, an overhead that may be introduced by a repetitive comparison of the diffraction beam with a desired diffraction beam and a repetitive aligning, as well as the task to determine a desired diffraction beam for a large amount of target portions, may be significantly reduced. An alignment performed for a subset of possible target portions (such as target portions comprising a specific alignment pattern such as an alignment marker) which are preferably spread over the substrate, may provide an alignment accuracy which is similar to that that would be obtained by performing the described acts for each target portion of the substrate. As an example, it may be possible to perform the described acts for 2, 3 or 4 target portions of the substrate which are spread (e.g., equidistantly) on the surface of the substrate close to an outer, circumferential border thereof.

To determine the desired diffraction beam, the diffraction beam may have been measured with the detector DET after having performed a highly accurate alignment by other means, e.g. by means of position sensing devices to sense a position of the substrate and a mask, by optical alignments and/or by comparing a position of a second pattern which is projected onto the substrate with a position of a first pattern which is already present on the substrate. Then, the desired diffraction beam may be measured by irradiating with the second pattern P'2 the beam on the substrate, thereby the beam interfering on the substrate with the first pattern P'1 which is already present on the substrate. Then, a slight misalignment may be introduced, e.g. by displacing the mask, and/or the substrate. Again, the diffraction beam may be measured. This may be repeated with different degrees of misalignment, thereby obtaining a diffraction beam at different relative positions of the mask MA with respect to the substrate W, thus at different stages of misalignment. It is possible that these measurements are performed with a misalignment in a single dimension, e.g. in the dimension indicated by the arrow SD, however it may be possible that these measurement are performed in dual dimensions, i.e. in the dimension indicated by the arrow SD as well as in a dimension perpendicular to the plane of drawing of FIG. 2. Thereby, a two-dimensional alignment may be made possible in the plane of the mask MA and substrate W.

Another method to define the desired diffraction pattern as a function of the irradiated part of the target portion, is by a calculation, based on knowledge of the existing pattern P'1 and the projected pattern P'2. When P'1 and P'2 are known, the desired diffraction pattern can be calculated by taking into account the optical properties of the projection lens PL, and the mathematics governing the diffraction process.

The patterns as described here may include integrated circuitry topology patterns or other patterns present on the substrate. Commonly, different layers of such patterns have a similar topology, thereby making them particularly suitable for the process as described here. Furthermore the fine structures of such patterns which may be in an order of magnitude of the wave-length of the beam B, facilitates an occurrence of diffraction to be detected by the detector DET. Further, the first and second pattern may include so-called scribelane markers or other markers in the pattern. Commonly, patterns to be applied onto the substrate are provided with markers, which are used e.g. for testing purposes or for other, existing alignment mechanisms known in the state of the art. Also patterns specifically designed for the process described here may be provided. By making use of such markers, it may be possible to reduce a fluctuation in position dependent diffraction on the substrate, as the markers may each have a same pattern. Furthermore, commonly a coating is applied onto the photosensitive resist to prevent diffractions of the irradiation. At the markers, such a coating may be omitted. Also, the marker structure can be chosen to have a larger pitch than that of a general pattern, making the diffraction effect less sensitive to wafer processing, like CMP: chemical mechanical polishing. This allows a proper alignment even in the presence of wafer processing that tends to degrade the diffraction effect on regular integrated circuit patterns.

Furthermore, a pattern of the marker may be selected such that a diffraction angle of the diffracted beams obtains a suitable value to enable the beam to be detected by the detector. In case that the angle of the fractions would be too small, the beam would travel back to the lens, thereby not making it possible to detect it with a detector as depicted in FIG. 2, only alternative configurations as described below would be possible in that case. If, however, the diffraction angle would be too large, few or no diffraction beams could be detected, as diffractions and diffraction angles would exceed, for example, 90°. Also, the usage of marker patterns avoids changes of the angle of the diffracted beam as a function of the position of the target portion, that results from a change in pitch of the patterns P'1 and P'2 as a function of this position.

The aligning of the substrate making use of the difference between the detected diffraction beam and the desired diffraction beam may be performed during irradiating the second pattern, thus providing for an alignment "on the fly", thus an aligning during irradiation of the second pattern. Also, the aligning may be performed during a process of irradiating the substrate with the second pattern: as an example, one of more second target portions may be irradiated for which the diffraction beam is detected (these second target portions may e.g. have been provided with a marker as the first pattern on the substrate), and before or during irradiating a remainder of the substrate, alignment may be performed making use of the difference between the detected and the desired diffraction beam. Thereby, a good alignment between the second pattern to be projected onto the substrate and the first pattern which is already present on the substrate, may be obtained, while minimizing an overhead due to the diffraction measurements and processing thereof, as these steps may be performed for only some of the target portions. As a further embodiment, to further reduce a processing load onto, e.g., a microprocessor or other processing device of the lithographic apparatus, the alignment may also be performed at a later moment in time, e.g. before or during a subsequent later irradiation of that target portion, e.g. when performing a following irradiation of the substrate with a following pattern.

The alignment may be performed by a suitable displacement of the substrate and the patterning device with respect to each other. This may be performed by displacing the substrate (such as by a displacement of the substrate table holding the substrate), displacing the patterning device, or both. A further possibility for aligning may be to effectuate a displacement of the patterned beam arriving at the substrate, the displacement being with respect to the substrate. Such displacement may be effectuated by any suitable action in the projection optics, such as the displacement of a suitable optical element (e.g. a mirror, lens, etc).

As depicted and described with reference to FIG. 2, a single diffraction beam is detected. It may however also be possible to detect at least two diffraction beams. Thereby, more information about alignment may be obtained. For example, a signal to noise ratio of the detected diffraction beam may be improved by detecting two or more diffraction beams. Also, immunity to tolerances may be increased, e.g. by detecting diffraction beams of a different order. Also, two dimensional alignment information may be derived by detecting diffraction beams which are substantially perpendicular to each other. Also, the diffraction beams may include diffraction beams of an opposite order, e.g. a first and minus first order diffraction beam, second and minus second order diffraction beam, etc. Also an immunity to noise and other tolerances or disturbance factors may be improved. When detecting more than one diffraction beam, use may be made of a plurality of detectors which are positioned at a suitable location to detect the respective diffraction beams.

The first and second target portions should at least partly overlap to enable the second patterned beam to at least partly illuminate the first target portion (where the first pattern has been provided on the substrate). The first target portion is illuminated by the first patterned beam to irradiate the first pattern onto the substrate. The second target portion is illuminated in a later processing step of a processing of the substrate thereby irradiating the second pattern onto the substrate. By the method and apparatus as described here, an alignment between the second patterned beam and the first pattern which has already been provided on the substrate, may be provided.

In FIG. 2, the diffracted beam is detected at substrate level, i.e. the diffracted beam is detected by a detector having a field of view which is directed towards the substrate, or more precisely towards one or more of the target portions (i.e. the first or the second target portion) of the substrate. Thereby, a good signal to noise ratio may be achieved as a diffracted beam having a relatively large intensity may be detected thereby. To reduce noise pick up or e.g. diffractions on other parts of the substrate, or other spurious signals or beams, the field of view of the detector may substantially coincide with or correspond to the second target portion of the substrate.

Figure 3:
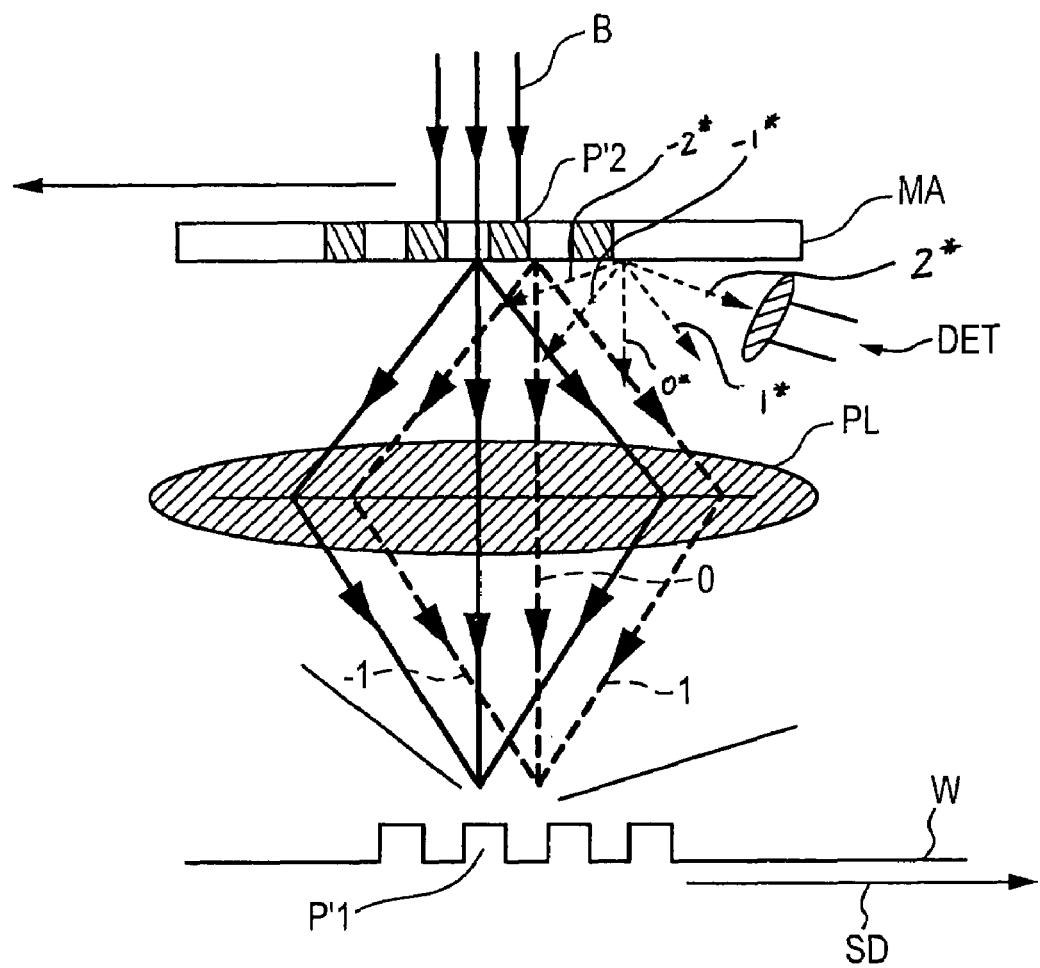
FIG. 3 depicts another setup for an alignment according to an embodiment of the invention.
Figure 4:
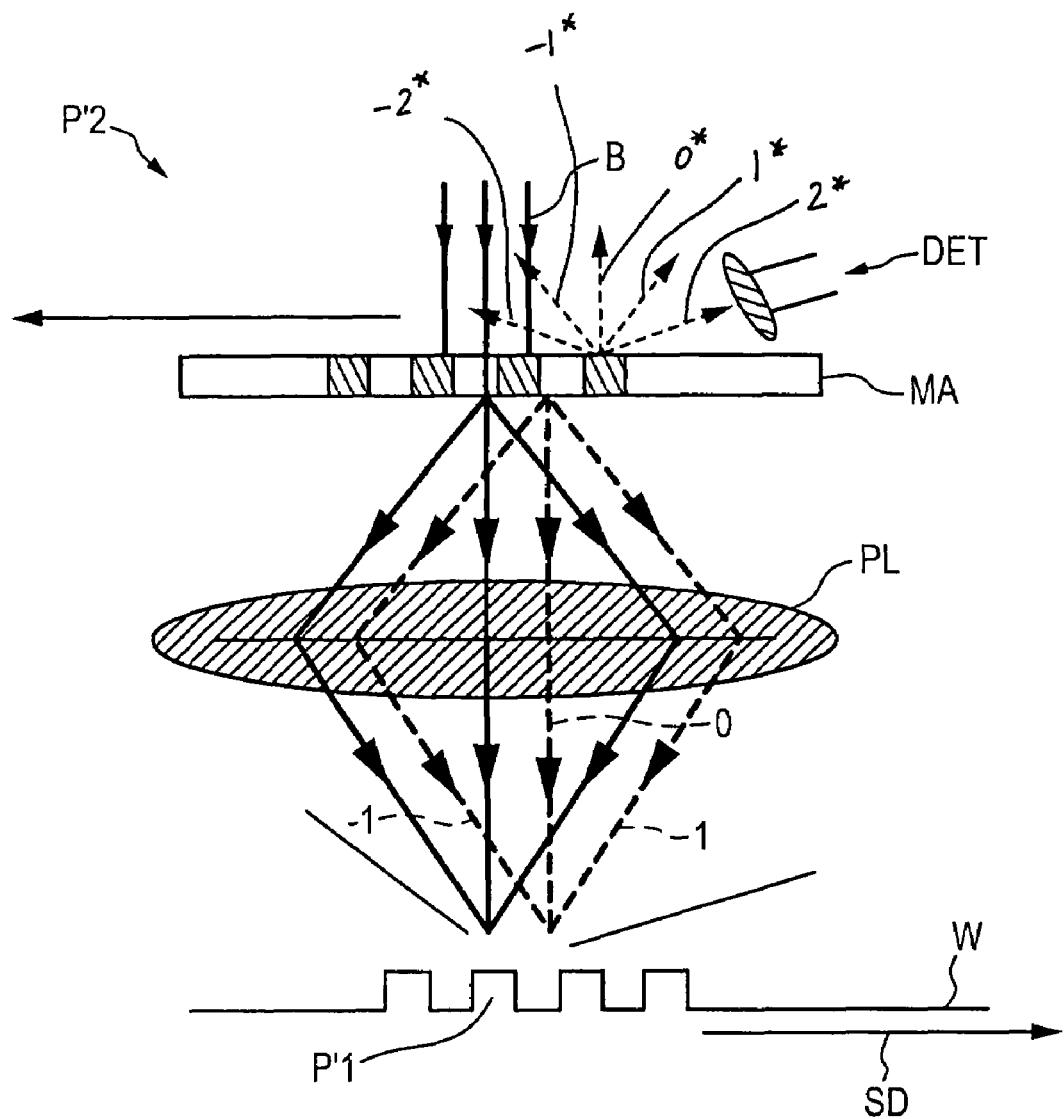
FIG. 4 depicts yet another setup for an alignment according to an embodiment of the invention.

Alternative embodiments are depicted in FIGS. 3 and 4. FIGS. 3 and 4 each show the beam B, mask MA including pattern P'2, projection lens PL, and substrate W including pattern P1. These elements have a same or similar function as described with reference to FIG. 2, and therefore a description thereof will be omitted here. In FIGS. 3 and 4, the diffracted beam −1, 0, 1 which is diffracted on the pattern P'1, travels through the projection lens P'1 and from there to the mask MA where it again diffracts on the pattern P'2 as indicated by −2*, −1* 0*, 1* and 2*. A thus twice diffracted beam is detected by the detector DET. The detector DET thus has a field of view that covers the mask MA, or more particularly the part of the mask MA that is currently being irradiated. The detector may detect any one of the orders such as −2*, −1*, 1* or 2*, in FIGS. 3 and 4 the second order 2 has been chosen as an example. The diffracted beam may be detected by the detector at either sides of the patterning device: In the embodiment shown in FIG. 3, the detector is positioned below the mask MA, hence viewing a reflection of the diffracted beam of a downstream side, thus a filed of view of the detector comprising a downstream face of the patterning device or mask MA. The detector may also be positioned above the mask as depicted in FIG. 4, hence viewing a transmitted beam through the mask MA, thus a field of view of the detector comprising an upstream face of the patterning device or mask MA. The placement of the detector near the mask is possible even when no space is available near the substrate in such a location that diffracted beams can be viewed. It is remarked that in FIGS. 2-4, the diffracted beams have been in the drawings slightly offset to the right for clarity purposes. Thus, in FIGS. 3 and 4, the diffracted beams −1, 0 and 1 are to be understood as to coincide with the (diffracted) patterned beam which travels from the patterning device via the projection system or projection lens to the substrate. Similarly, the diffracted beams −2, −1, 0 1, 2 in FIG. 2 are to be understood as to originate from a same place on the substrate as the place where the patterned beam arrives at the substrate. Also, the diffracted beams −2*, −1*, 0*, 1* and 2* in FIG. 3 and FIG. 4 are to be understood as to originate at the patterning device from a same place as the place where the diffracted beams −1, 0, 1 arrive via the projection lens at the patterning device.

Figure 5A:
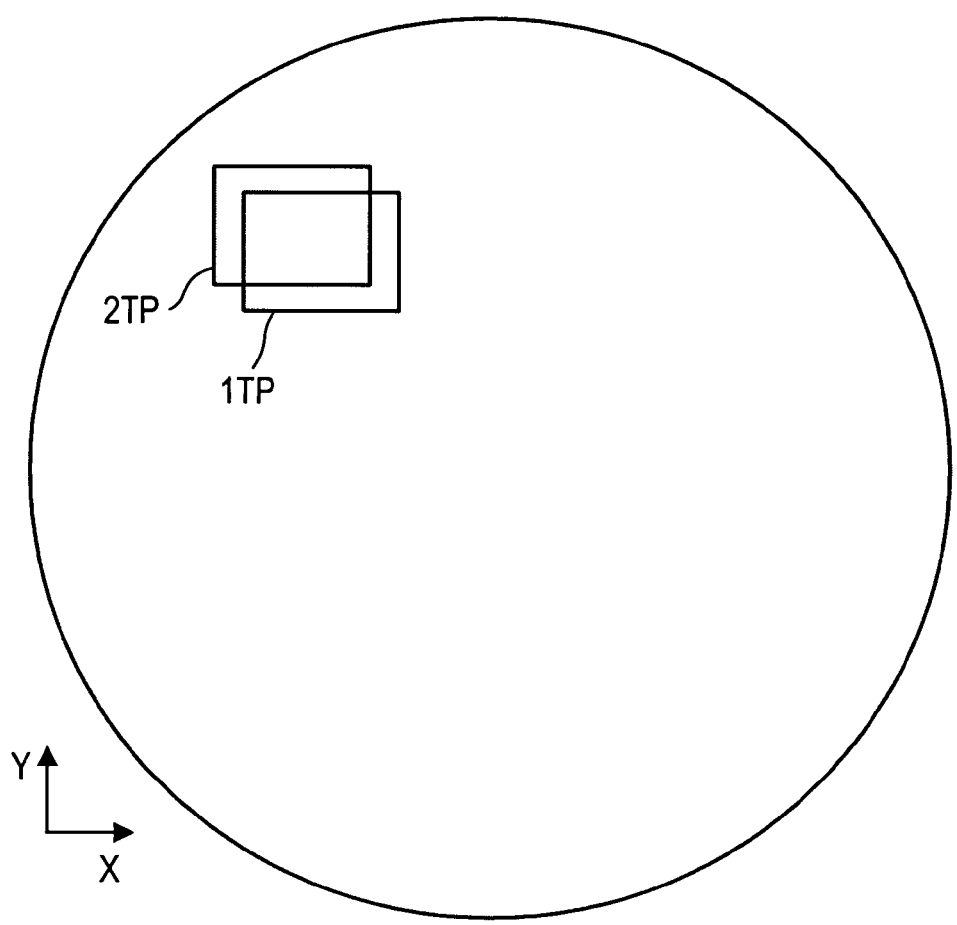
FIGS. 5A and 5B highly schematically depict a top view of a part of the substrate to explain some embodiment mentioned in the present patent application.

FIG. 5A shows a top view of a substrate in which an example of a first target portion 1TP and second target portion 2TP are depicted. In this example, the target portions partly overlap each other. The target portions may have any size with respect to the size of the substrate. As an example, the target portions may cover the substrate in full, or as another example, the target portions consist of a single spot of irradiation only, e.g. applied in a so-called e-beam lithography applications. Further examples of the target portions have been described above. The target portions may but need not have a same size, shape, etc. As long as the second target portion at least partly overlaps a part of the first pattern on the substrate, diffraction may occur enabling to apply the diffraction detection and alignment as described here. The first and second patterned beams may have been created by directing a beam to a mask MA which provides a pattern, such as depicted in FIGS. 2-4.

Alternative however, many other possibilities are available, as an example, a single beam may be applied which "writes" a pattern onto the substrate by a suitable movement of the beam and the substrate with respect to each other. Thus, in the context of this document, the term patterned beam may include a beam which is patterned by any kind of reflective, transmissive, etc. pattern, such as a mask however it may equally be the case that the beam is patterned in any other way, such as by having the beam "write" the pattern onto the substrate by a suitable movement of beam and substrate with respect to each other. In the context of this document, the term desired diffraction beam may be understood as a single diffraction beam, however it may also be the case that a plurality of diffraction beams is detected (e.g. using a plurality of detectors) and thus compared with a plurality of corresponding desired diffraction beams. The aligning may be performed by making use of the comparing of the detected and desired diffraction beams. This may be performed making use of a relationship between the diffraction beam and an amount of misalignment, which may e.g. be obtained by suitable measurements as described above. Other possibilities are the calculation as described above based on the existing (P'1) and newly exposed (P'2) patterns, combined with projection system characteristics.

Figure 5B:
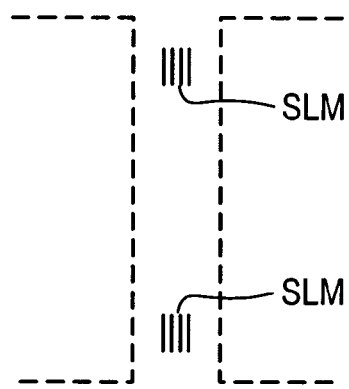

FIG. 5B shows a schematic view of a part of a surface of a substrate on which scribe lane markers SLM have been provided. The scribe lane markers are located in integrated circuit topologies ICP which have been depicted highly schematically. In a general form, scribe lane markers may consist of a number of parallel lines. The pitch, or distance between, these lines together with the wavelength of the illumination source determine the angles of diffraction when the marker is illuminated. The markers in FIG. 5B could preferably have a length more or less coinciding with the length of the target portion. In FIG. 5B, if the vertical direction is the scanning direction Y, illuminating the markers with a similar pattern as the markers themselves, results in a diffraction effect in the horizontal (X) direction. By monitoring the diffraction orders a difference in position of the substrate with respect to the patterning device in X direction could be detected. Similarly, the markers may contain horizontal lines, enabling a detection of a difference in position in the scanning (Y) direction. As depicted in FIG. 5B, scribelane markers are preferably positioned between two target portions lying next to each other.

Figure 6:
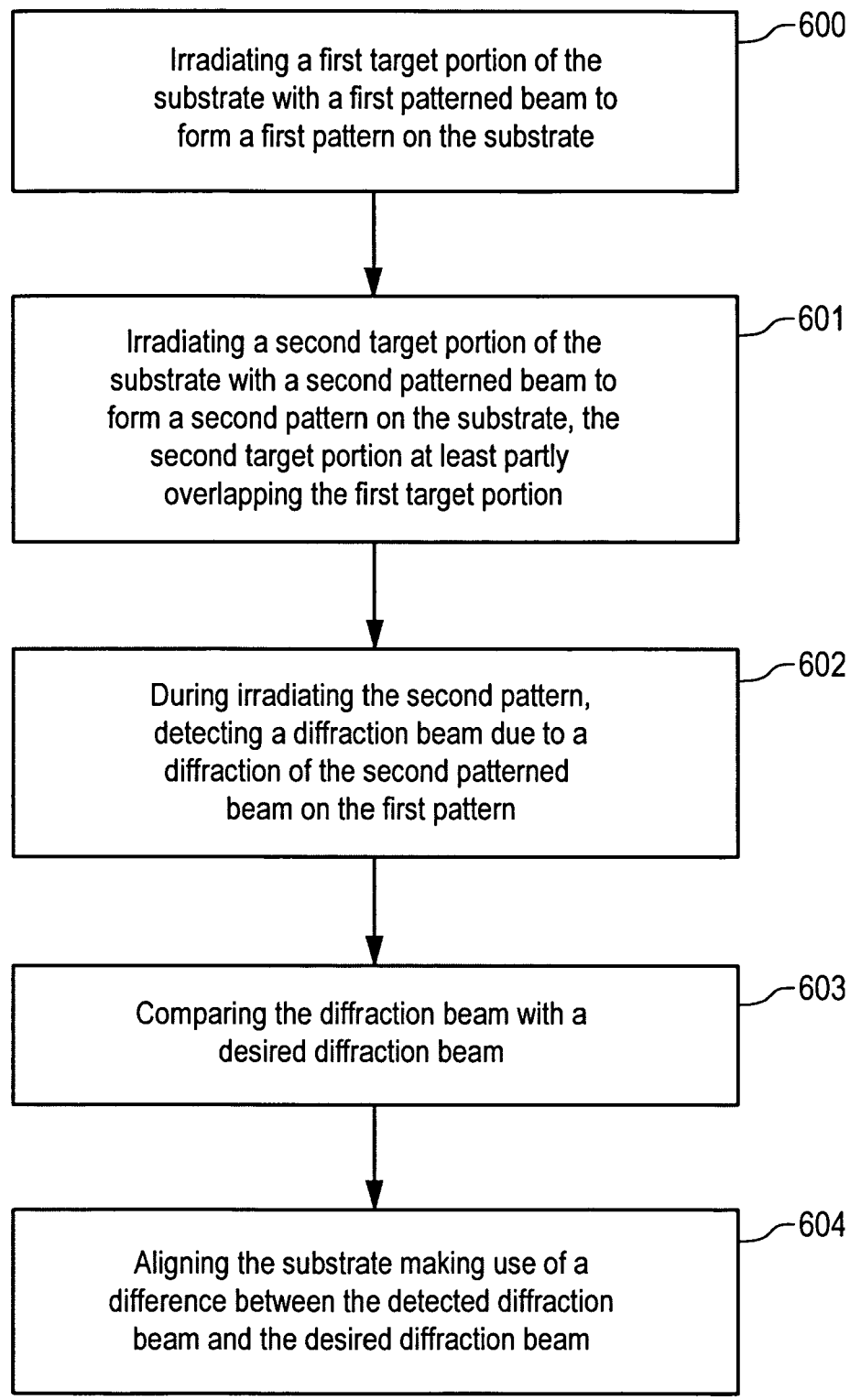
FIG. 6 depicts a flow diagram of an alignment method according to an embodiment of the invention.

FIG. 6 shows a flow diagram of the method according to an embodiment of the invention. In block 600, a first target portion of the substrate is irradiated with a first pattern beam to form a first pattern on the substrate. In block 601 a second target portion of the substrate is irradiated with a second pattern beam to form a second pattern on the substrate. The second target portion at least partly overlaps the first target portion. In block 602, during irradiating the second pattern, a diffraction beam is detected. The diffraction beam is due to a diffraction of the second pattern beam on the first pattern. In block 603, the diffraction beam is compared with a desired diffraction beam. In block 604, the substrate is aligned making use of a difference between the detected diffraction beam and the desired diffraction beam. In other words, in block 604, the substrate is aligned making use of the comparison between the detected diffraction beam and the desired diffraction beam. The alignment may be performed by a suitable displacement of the mask, the substrate, or a part of the projection system.

It is noted that in this document the term diffracted beam and diffraction beam are intended to have a same meaning, and refer to the same beam.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequence of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for aligning a substrate in a lithographic apparatus, the method comprising:
   a) irradiating a first target portion of the substrate with a first patterned beam to form a first pattern on the substrate;
   b) irradiating a second target portion of the substrate with a second patterned beam to form a second pattern on the substrate, the second target portion at least partly overlapping the first target portion;
   c) during irradiating the second target portion, detecting a diffraction beam due to a diffraction of the second patterned beam on the first pattern;
   d) comparing the diffraction beam with a desired diffraction beam; and
   e) aligning the substrate based on a difference between the detected diffraction beam and the desired diffraction beam.

2. The method according to claim 1, wherein the first pattern and the second pattern comprise integrated circuit topology patterns.

3. The method according to claim 1, wherein the first pattern and the second pattern comprise scribe lane markers.

4. The method according to claim 1, wherein e) is performed during a progress of c).

5. The method according to claim 1, wherein e) is performed before a subsequent irradiation of the substrate.

6. The method according to claim 1, wherein c) comprises detecting at least two diffraction beams.

7. The method according to claim 6, wherein the two diffraction beams comprise diffraction beams of a different order.

8. The method according to claim 6, wherein the two diffraction beams comprise diffraction beams substantially perpendicular to each other.

9. The method according to claim 6, wherein the two diffraction beams comprise an nth and a −nth diffraction order beam, n comprising a natural number.

10. The method according to claim 1, wherein the diffracted beam is detected at c) at a substrate level, a field of view of a detector to detect the diffracted beam being directed towards the substrate.

11. The method according to claim 10, wherein a field of view of the detector substantially covers the second target portion of the substrate.

12. The method according to claim 1, wherein the diffracted beam is detected at c) after the diffracted beam is passed through a projection system that projects the first and second patterned beams and after the diffracted beam is diffracted by a patterning device that forms the first and second patterned beams, a field of view of the detector to detect the diffracted beam being directed towards the patterning device.

13. The method according to claim 12, wherein the field of view of the detector is directed towards a downstream face of the patterning device.

14. The method according to claim 12, wherein the field of view of the detector is directed towards an upstream face of the patterning device.

15. The method according to claim 1, wherein the desired diffraction beam is determined by repetitively illuminating the first pattern with a second pattern and employing a different offset between the first pattern and the second pattern.

16. A lithographic apparatus comprising:
    a projection system configured to project on a first target portion of the substrate a first patterned beam to form a first pattern on the substrate, and to project on a second target portion of the substrate a second patterned beam to form a second pattern on the substrate, the second target portion at least partly overlapping the first target portion;

a detector configured to detect, during projection of the second pattern, a diffraction beam due to a diffraction of the second patterned beam on the first pattern;

a comparator configured to compare the diffraction beam with a desired diffraction beam; and a positioning system configured to align the substrate based on a difference between the detected diffraction beam and the desired diffraction beam.

17. The lithographic apparatus according to claim 16, wherein the first pattern and the second pattern comprise integrated circuit topology patterns.

18. The lithographic apparatus according to claim 16, wherein the first pattern and the second pattern comprise scribe lane markers.

19. The lithographic apparatus according to claim 16, wherein alignment by the positioning system is performed during projection of the second pattern.

20. The lithographic apparatus according to claim 16, wherein alignment by the positioning system is performed before a subsequent irradiation of the substrate.

21. The lithographic apparatus according to claim 16, wherein the detector comprises at least two photodetectors to detect at least two diffraction beams.

22. The lithographic apparatus according to claim 21, wherein the two diffraction beams comprise diffraction beams of a different order.

23. The lithographic apparatus according to claim 21, wherein the two diffraction beams comprise diffraction beams that are substantially perpendicular to each other.

24. The lithographic apparatus according to claim 21, wherein the two diffraction beams comprise an nth and a −nth diffraction order beam, n comprising a natural number.

25. The lithographic apparatus according to claim 16, wherein a field of view of the detector is directed towards the substrate to detect the diffracted beam at a substrate level.

26. The lithographic apparatus according to claim 25, wherein a field of view of the detector substantially covers the second target portion of the substrate.

27. The lithographic apparatus according to claim 16, wherein a field of view of the detector is directed towards a patterning device that forms the first and second patterned beams, to detect the diffracted beam that is passed through the projection system and that is diffracted by the patterning device.

28. The lithographic apparatus according to claim 27, wherein the field of view of the detector is directed towards a downstream face of the patterning device.

29. The lithographic apparatus according to claim 27, wherein the field of view of the detector is directed towards an upstream face of the patterning device.

30. The lithographic apparatus according to claim 16, wherein the desired diffraction beam is determined by repetitively illuminating the first pattern with a second pattern and employing a different offset between the first pattern and the second pattern.

* * * * *